United States Patent [19]

Capwell et al.

[11] Patent Number: 4,707,377
[45] Date of Patent: Nov. 17, 1987

[54] COPPER PLATING

[75] Inventors: Robert J. Capwell; Ronald A. Kaschak, both of Vestal; Donald G. McBride, Binghamton; Robert G. Rickert, Johnson City; Donald P. Seraphim, Vestal, all of N.Y.

[73] Assignee: International Business Machines Corporation, Armonk, N.Y.

[21] Appl. No.: 925,511

[22] Filed: Oct. 27, 1986

Related U.S. Application Data

[63] Continuation of Ser. No. 547,298, Oct. 31, 1983, abandoned.

[51] Int. Cl.$^4$ ............................................. C23C 18/40
[52] U.S. Cl. ........................................ 427/8; 427/345; 427/443.1
[58] Field of Search ........................ 427/8, 345, 443.1

[56] References Cited

U.S. PATENT DOCUMENTS

| | | |
|---|---|---|
| 3,635,758 | 1/1972 | Schneble . |
| 3,844,799 | 10/1974 | Undeckofler . |
| 3,959,531 | 5/1976 | Schneble .............................. 427/345 |
| 4,002,786 | 1/1977 | Hirohata . |
| 4,152,467 | 5/1979 | Alpaugh ................................. 427/8 |

FOREIGN PATENT DOCUMENTS 7734995 6/1978 France .
1588758 4/1981 United Kingdom .

OTHER PUBLICATIONS

Paunovic, "Electrochemical Aspects of Electroless Deposition of Metals", Photo Circuits Corporation, Plating, Nov. 1968, pp. 2–8.
Tucker, "Instrumentation and Control of Electroless Copper Plating Solutions", American Electroplaters' Society, Inc., Ft. Worth, Texas—Jan. 21–22, 1976.
Greene, "Evaluating the Condition of Electroless Plating Baths", IBM TDB, vol. 17, No. 3, Aug. 1964, pp. 171, 172.

Primary Examiner—John D. Smith
Attorney, Agent, or Firm—Pollock, Vande Sande & Priddy

[57] ABSTRACT

Copper is plated onto a substrate from an electroless plating bath having a mix potential relative to a saturated calomel electrode of about minus 630 to about minus 675 millivolts at a temperature of about 73° C. The mix potential of the bath is monitored and adjusted during the plating to maintain it at about minus 630 to about minus 675 millivolts with respect to a calomel electrode at a temperature of about 73° C. The number of of plating void defects is thereby reduced.

13 Claims, No Drawings

COPPER PLATING

This application is a continuation of Ser. No. 547,298, filed on Oct. 31, 1983, now abandoned.

DESCRIPTION

1. Technical Field

The present invention is concerned with a method for depositing copper onto a substrate from an electroless plating solution. The present invention makes it possible to substantially reduce the presence of plating voids from the electroless plating bath.

2. Background Art

The electroless plating of copper onto a substrate is well-known in the prior art. For instance, an electroless or autocatalytic copper plating bath usually contains a cupric salt, a reducing agent for the cupric salt, a chelating or complexing agent, and a pH adjuster. In addition, if the surface being plated is not already catalytic for the deposition of the desired metal, a suitable catalyst is deposited on the surface prior to contact with the plating bath. Among the more widely employed procedures for catalyzing a substrate is the use of stannous chloride sensitizing solution and a palladium chloride activator to form a layer of metallic palladium particles.

Although the technology relative to electroless copper plating is continually being improved, there still remains room for additional improvement. Certain problems are especially pronounced when preparing articles of very high quality such as those to be employed in printed circuit applications, e.g., printed circuit boards which contain high-density circuitry and large numbers of holes such as through-holes and blind holes. The problems encountered include the formation of voids on the surface and in the coatings located in the holes. This, in turn, can cause unreliable electrical connections. Moreover, even if the electrical connections initially are adequate, the presence of voids tends to cause the coatings to crack during use of the circuits. During operation, integrated circuit boards tend to expand and contract somewhat. Any discontinuities in the coating represent a prime site for cracking due to the mechanical stress from such expansion and contraction.

Moreover, a major reason for yield loss in electroless plating is the formation of what is known as extraneous copper or nodules. The formation of nodules in unwanted areas on a substrate can result in short-circuiting by forming contact between circuit lines on the substrate. In addition, such processes as providing protective coatings, providing solder, and pin insertion are adversely effected by the presence of nodules on the surface.

Various attempts to reduce void formation result in significant increase in the formation of nodules. Likewise, attempts to reduce nodule formation have resulted in significant increase in void formation. Accordingly, it would be advantageous and desirable to reduce the formation of voids without a significant increase in the formation of extranseous copper or nodules.

SUMMARY OF INVENTION

The present invention provides a method for significantly reducing, if not entirely eliminating, the formation of voids during plating, from an electroless copper plating bath. In addition, the present invention makes it possible to reduce plating voids without greatly increasing the formation of extraneous copper or nodules.

The present invention is concerned with plating copper from an electroless plating bath onto a substrate. In particular, an electroless aqueous copper plating bath containing a source of cupric ion, a reducing agent for the cupric ion, and a complexing agent for the cupric ion in amounts effective to plate copper onto the substrate, is provided. The plating bath has a mix potential relative to a saturated calomel electrode of about minus 630 to about minus 675 millivolts at a temperature of about 73° C. The substrate to be coated is provided in the plating bath.

Since the composition and mix potential of the bath tend to drift or change during the plating, the mix potential of the bath is monitored during plating. The composition of the bath is adjusted to maintain the mix potential during plating at about minus 630 to about minus 675 millivolts with respect to a saturated calomel electrode at a temperature of about 73° C.

BEST AND VARIOUS MODES FOR CARRYING OUT INVENTION

According to the present invention, it has been found that improved plating can be achieved by providing and maintaining a copper plating bath having a mix potential relative to a saturated calomel electrode of about minus 675 to about minus 630, preferably about minus 650 to about minus 630, and most preferably about minus 630 at a temperature of about 73° C.

By maintaining the mix potential of the plating at the preferred value of about minus 630, minimum nodule formation is achieved with a small sacrifice in reducing void formation. The value of about minus 675 provides for the minimum void formation, but with a somewhat greater, but acceptable, sacrifice in the amount of nodules which tend to form. The former situation and conditions are preferred.

The potential of operation of the bath, the mix potential or EMIX, is between the potential which characterizes the reduction of the cupric ion in the absence of the reducing agent and the potential which characterizes the oxidation of the reducing agent in the absence of the cupric ions.

The mix potential is monitored by placing a saturated calomel electrode and copper surface or coupon into the bath and electrically connecting a millivoltmeter to the calomel electrode and copper surface. When the bath temperature is not 73° C., the above values for the mix potential are adjusted upwardly or downwardly, depending upon the temperature of the bath in accordance with well-known tables.

The surface upon which the copper is plated must be catalytic for the deposition of copper. In the event the surface being plated is not already catalytic for the deposition of the copper, a suitable catalyst is deposited on the surface prior to contact with the plating bath. Among the more widely employed procedures for catalyzing a substrate is the use of a stannous chloride sensitizing solution and a palladium chloride activator to form a layer of metallic palladium particles. One such surface is an epoxy-fiberglass laminate containing already deposited copper in those areas where copper is to be plated and/or being seeded with a stannous chloride and palladium chloride activating system.

The copper electroless plating bath is generally an aqueous composition which includes a source of cupric ion, a reducing agent, a complexing agent for the cupric ion, and a pH adjuster. The plating baths also preferably include a cyanide ion source and a surface-active agent.

The cupric ion source generally used is a cupric sulfate (e.g., $CuSO_4 \cdot 5H_2O$) or a cupric salt of the complexing agent to be employed.

It is preferred to use amounts of cupric ion source from about 3 to about 15 g/l calculated as $CuSO_4 \cdot 5H_2O$. The most common reducing agent employed is formaldehyde which, in the preferred aspects of the present invention, is used in amounts from about 0.7 to about 7 g/l.

Examples of some other reducing agents include formaldehyde precursors or derivatives such as para-formaldehyde, trioxane, dimethylhydantoin, glyoxal; borohydrides such as alkali metal borohydrides (sodium and potassium borohydride) and substituted borohydrides such as sodium trimethoxy borohydride; boranes such as amine borane (isopropyl amine borane and morpholine borane).

Examples of some suitable complexing agents include Rochelle salts, ethylene diamine tetraacetic acid, the sodium (mono-, di-, tri-, and tetra-sodium) salts of ethylene diamine tetraacetic acid, nitrolotetraacetic acid and its alkali salts, gluconic acid, gluconates, triethanol amine, glucono (gamma)-lactone, modified ethylene diamine acetates such as N-hydroxyethyl, and ethylene diamine triacetate. In addition, a number of other suitable cupric complexing agents are suggested in U.S. Pat. Nos. 2,996,408; 3,075,856; 3,075,855; and 2,938,805. The amount of complexing agent is dependent upon the amount of cupric ions present in the solution and is generally from about 20 to about 50 g/l.

The plating bath can also include a surfactant which assists in wetting the surface to be coated. A satisfactory surfactant is, for instance, an organic phosphate ester available under the trade designation "Gafac RE-610". Generally, the surfactant is present in amounts from about 0.02 to about 0.3 g/l. In addition, the pH of the bath is also generally controlled, for instance, by the addition of a basic compound such as sodium hydroxide or potassium hydroxide in the desired amount to achieve the desired pH. The preferred pH of the electroless plating bath is between about 11.6 and 11.8.

Also, preferably, the plating bath contains a cyanide ion and most preferably contains about 10 to about 25 mg/l to provide a cyanide ion concentration in the bath within the range of 0.0002 to 0.0004 molar. Examples of some cyanides which can be employed according to the present invention are the alkali metal, alkaline earth metal, and ammonium cyanides. In addition, the plating bath can include other minor additives as is known in the art.

The preferred plating baths employed have a specific gravity within the range of 1.060 to 1.080. Moreover, the temperature of the bath is preferably maintained between about 70° C. and 80° C., preferably between about 70° C. and 75° C. and most preferably about 73° C.

For a discussion of the preferred plating temperature coupled with the preferred cyanide ion concentrations, see U.S. Pat. No. 3,844,799.

Also, it is preferred to maintain the $O_2$ content of the bath between about 2 ppm and 4 ppm and preferably about 2.5 to about 3.5 ppm, as discussed in U.S. Pat. No. 4,152,467. The $O_2$ content can be controlled by injecting oxygen and an inert gas into the bath.

The overall flow rate of the gases into the bath is generally from about 1 to about 20 SCFM per thousand gallons of bath and preferably from about 3 to about 8 SCFM per thousand gallons of bath.

Although the above ranges of constituents referred to above are the same as those disclosed in U.S. Pat. No. 4,152,467, none of the examples therein have the necessry particular mix potential values required by the present invention, since not all combinations of amounts within the above ranges will provide the desired mix potential values. It is necessary to select proper combinations of amounts of the ingredients to achieve the desired mix potential values. However, once a person skilled in the art is aware of the present invention and the criticality of the mix potential values disclosed herein, the preparation of plating baths to achieve these potentials can be determined without undue experimentation.

In the event the mix potential of the bath is determined to be outside of the specified range, the cupric ion content, reducing agent content, oxygen content, complexing agent, and cyanide salt content are determined by well-known testing techniques to determine if any one or more of these constituents are outside of the ranges given above and if so, the amount of constituent(s) outside of the ranges discussed hereinabove is adjusted accordingly. In addition, if the amounts of such constituents are within the ranges discussed hereinabove, but the mix potential is outside of the range specified hereinabove, one can then investigate for possible bath contaminates and if found, can remove such from the bath.

Moreover, if the amounts of such constituents are within the ranges discussed hereinabove, but the mix potential is outside of the range specified hereinabove, the mix potential can be lowered by increasing the reducing agent and/or the complexing agent and/or reducing the cupric ion concentration, but still maintaining the amounts of each within the ranges discussed hereinabove. The relative amount of any increase or decrease of constituent can be determined without undue experimentation.

The determination of the various amounts of the above substituents can be carried out by well-inown analytical techniques using well-known equipment which need not be described herein in any great detail. For instance, the dissolved oxygen can be determined by use of a dissolved oxygen meter probe such as a Leeds and Northrup Monitor 7931-10 and Probe 7931-30.

The cyanide concentration can be determined by a cyanide electrode and meter such as a Beckman Monitor 646949 pH-Model 942 and Graphic Controls Probe pH-193150 having a pH range of 11-13. The cupric salt can be determined by a UV-VIS. For example, a Gilford Spectrophotometer Model STA-SAR 2 can be used for the cupric salt determination. The complexing agent and reducing agent can be determined by known potentiometric titrations.

Tests conducted employing plating baths as described hereinabove with mix potentials in the ranges specified above and particularly, about minus 650 millivolts and about minus 630 millivolts, results in quantities of plating voids of less than one per side, while plated manufacturing subassemblies have quantities of plating voids from about 20 per side to about 8 per side with plating baths of the same constituents (i.e., the preferred baths disclosed in U.S. Pat. No. 4,152,467), but having mix potential of about minus 580.

Also, tests conducted on laboratory plating cells using a plating bath of about minus 630 millivolts show about ½ to about 1/5 the plating voids produced with plating baths of the same constituents disclosed in U.S. Pat. No. 4,152,467, but having a mix potential of about minus 580. In addition, the nodule formation in the baths, in accordance with the present invention, is not significantly increased as compared to the baths with potential of about minus 580.

What is claimed is:

1. A process for plating copper from an electroless plating bath onto a substrate to reduce plating voids comprising:
    (a) providing an electroless aqueous copper plating bath containing a source of cupric ion, a reducing agent for the cupric ion, and a complexing agent for the cupic ion in amounts effective to plate copper onto said substrate, wherein said bath, at a temperature of about 73° C., has a mix potential relative to a saturated calomel electrode of about minus 630 to about minus 675 millivolts;
    (b) providing said substrate in said plating bath;
    (c) monitoring the mix potential of said bath during plating including placing in said bath during plating and at the plating temperature a reference electrode; and
    (d) adjusting the composition of said bath to maintain the mix potential during plating at about minus 630 to about minus 675 millivolts with respect to a saturated calomel electrode at a temperature of about 73° C.; and
    (e) wherein the temperature of the bath is maintained between about 70° C. and 80° C. during the plating.

2. The process of claim 1 wherein said mix potential is about minus 630 to about minus 650 millivolts.

3. The process of claim 1 wherein said mix potential is about minus 630 millivolts.

4. The process of claim 1 wherein the source of cupric ion is cupric sulfate.

5. The process of claim 1 wherein the reducing agent is formaldehyde.

6. The process of claim 1 wherein said complexing agent is ethylene diamine tetraacetic acid or salt thereof.

7. The process of claim 1 wherein said bath also contains cyanide ion.

8. The process of claim 1 wherein the temperature of the bath is maintained between about 70° C. and about 75° C. during the plating.

9. The process of claim 1 wherein the temperature of the bath is maintained at about 73° C. during plating.

10. The process of claim 1 wherein said plating bath consists essentially of a source of cupric ion, a reducing agent for the cupric ion, a complexing agent for the cupric ion, a pH adjustor, a surfactant, and cyanide ion.

11. The process of claim 1 wherein composition of the bath is adjusted to maintain said mix potential during plating by adjusting at least one member of the group of cupric ion content, reducing agent content, oxygen content, complexing agent, and cyanide ion content.

12. The process of claim 1 which comprises adjusting the bath to maintain said mix potential during plating by removal of contaminates from the bath.

13. The process of claim 1 wherein the pH of said bath is about 11.6 to about 11.8.

* * * * *